United States Patent [19]

Remedi

[11] 4,145,759
[45] Mar. 20, 1979

[54] VIRTUAL POWER SUPPLY ROM
[75] Inventor: James J. Remedi, Austin, Tex.
[73] Assignee: Motorola, Inc., Schaumburg, Ill.
[21] Appl. No.: 895,848
[22] Filed: Apr. 13, 1978
[51] Int. Cl.² .............................................. G11C 11/40
[52] U.S. Cl. ...................................... 365/203; 365/51;
365/103; 307/238
[58] Field of Search ................... 365/51, 103, 104, 203

[56] References Cited
U.S. PATENT DOCUMENTS
4,082,966  4/1978  Lou ....................................... 365/203

Primary Examiner—Terrell W. Fears
Attorney, Agent, or Firm—Joe E. Barbee

[57] ABSTRACT

A read-only-memory is provided on a semiconductor chip having a reduced number of power supply lines. The memory has a plurality of storage cells arranged in an array. Vertical lines define columns of the memory. Every other vertical line is coupled to a first node. The first node is controllably coupled to a first voltage potential to controllably precharge the first node. The vertical lines not connected to the first node are connected to an output node. P channel field effect transistors are used to couple the vertical lines to the first node and to the output node. A plurality of N-channel field effect transistors controllably couple the vertical lines to a second voltage potential. A vertical line on one side of the column of memory cells is used to provide a precharge voltage to the cell while a vertical line on the other side of the column of memory cells is used to conduct stored information from the cell to the output node. The vertical lines are shared by adjacent columns of memory cells thereby reducing the number of power supply lines.

14 Claims, 1 Drawing Figure

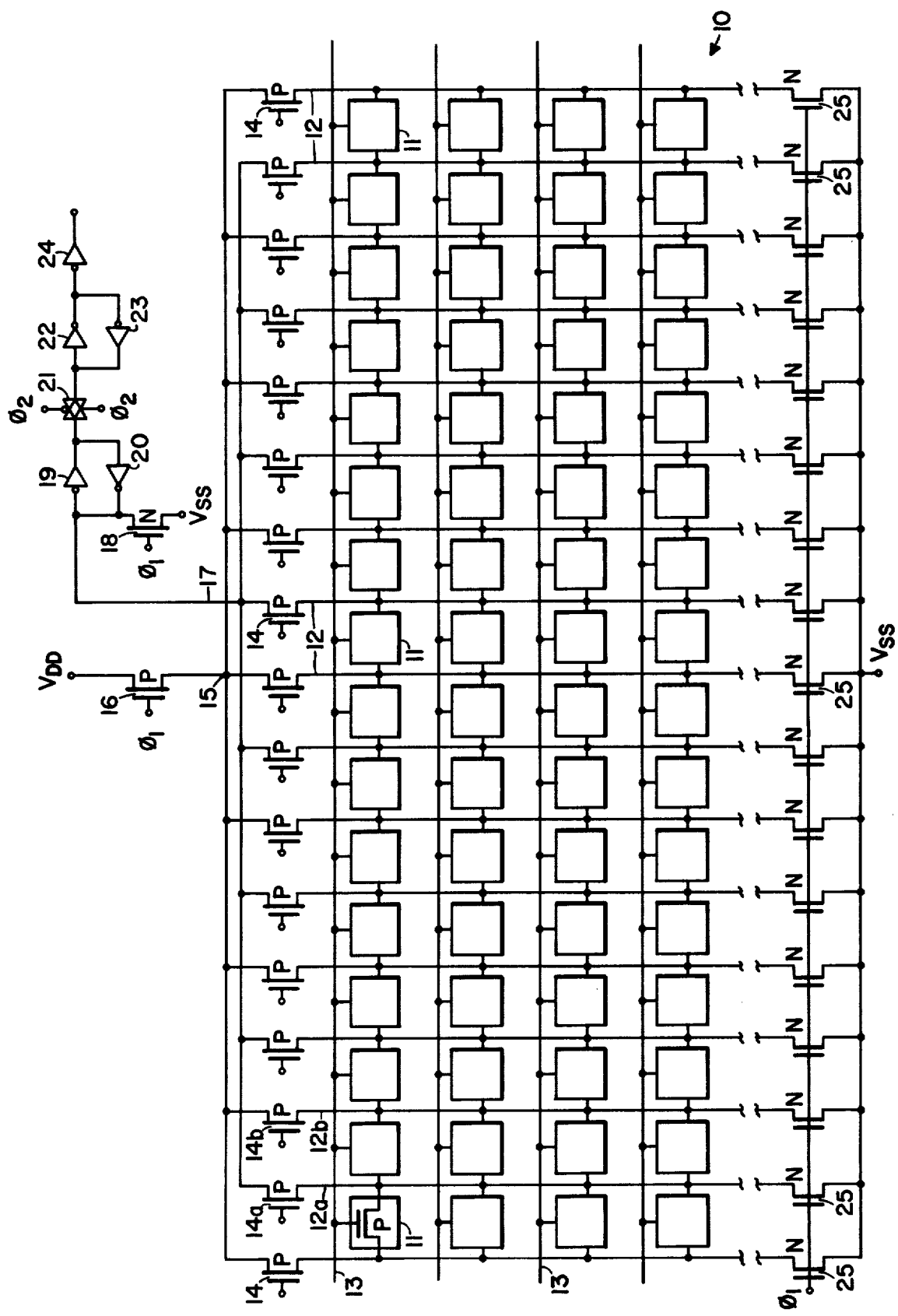

VIRTUAL POWER SUPPLY ROM

BACKGROUND OF THE INVENTION

Reference to Related Case

A related case is my case entitled "Versatile CMOS Decoder" Ser. No. 896071, filed on the same day and assigned to the same assignee as the present application.

This invention relates, in general, to memories and more particularly, to read-only-memories (ROM) having a reduced number of power supply lines.

Generally, power supply lines consume a considerable amount of area on a semiconductor chip and it is highly desirable to reduce the number of lines required or to route them in a manner so that they will occupy a minimal amount of area. Memories, particularly ROMs, are arranged in an array. Since ROMs have a single transistor memory cell, the cells can be spaced closely together and the fewer the number of power supply lines the less area the total ROM occupies. The power supply lines are comprised by the voltage lines and the return or reference lines.

Accordingly, it is an object of the present invention to provide a ROM having a reduced number of power supply lines.

Another object of the present invention is to provide a ROM which shares the lines between the columns of the ROM with adjacent columns.

SUMMARY OF THE INVENTION

In carrying out the above and other objects of the invention in one form, there is provided an improved ROM having a reduced number of power supply lines. The ROM has a plurality of memory cells arranged in an array having columns. Each column is defined by a first and a second vertical line. All the first lines are coupled to a first node. The first node can be controllably precharged to a first voltage potential. All the second lines of the columns are coupled to an output node. Each of the first and second vertical lines is also controllably coupled to a second voltage potential node.

The subject matter which is regarded as the invention is set forth in the appended claims. The invention itself, however, together with further objects and advantages thereof, may be better understood by referring to the following detailed description taken in conjunction with the accompanying drawings.

BRIEF DESCRIPTION OF THE DRAWING

A single FIGURE illustrates the preferred embodiment of the invention.

The exemplification set out herein illustrates the preferred embodiment of the invention in one form thereof, and such exemplification is not to be construed as limiting in any manner.

DESCRIPTION OF THE PREFERRED EMBODIMENTS

Referring now to the single FIGURE, there is shown a read-only-memory or ROM 10. ROM 10 contains a plurality of memory cell locations 11. By way of example, memory cell location 11 can contain a P-channel field effect transistor to indicate a logic "1" for that particular memory cell location. If the memory cell location contains a logic "0" then there would be no field effect transistor in that particular location. ROM 10 is arranged into a plurality of columns which are defined by vertical lines 12. Note that, except for the vertical lines at each end of the ROM, the vertical lines are shared by two different columns of memory cells. In addition, every other vertical line 12 can be considered a drive line for the ROM while the vertical lines in between the every other vertical line is like a sense line and is coupled to an output node or line 17. Every line such as line 12a is coupled by a P-channel field effect transistor 14a to an output node 17 while the in-between vertical lines 12b are coupled to node 15 by a P-channel field effect transistor such as 14b. Node 15 is coupled to a voltage supply $V_{DD}$ by a P-channel field effect transistor 16. Each vertical line 12 is coupled at its lower end by an N-channel field effect transistor 25 to a second voltage potential $V_{SS}$ which is usually a ground, reference level, or the most negative voltage in the circuit. Output line or node 17 can be precharged to voltage $V_{SS}$ by N-channel field effect transistor 18. A pair of back-to-back inverters 19 and 20 are coupled to output 17 to provide a static output for ROM 10. The input to inverter 19 is inverted and connected to the input of inverter 20 which inverts it again and couples the output of inverter 20 back to the input of inverter 19. This latches the output to provide a static output.

By way of example, the output from back-to-back inverters 19 and 20 can be switched by transmission gate 21 which is gated by a clock signal $\phi 2$. The output of transmission gate 21 is connected to another pair of back-to-back inverters 22 and 23 to provide a static output on the output side of transmission gate 21. If desired, this output from back-to-back inverters 22 and 23 can again be inverted by an inverter 24. It will be understood by those skilled in the art that the inverters and transmission gate 21 are not necessary to the utilization of the present invention. The purpose of transmission gate 21 is to retime the output to coincide with the $\phi 2$ clock signal.

Operation of ROM 10 is as follows. To begin with, when clock signal $\phi 1$ goes to a high level, N-channel field effect transistors 25 are enabled thereby precharging vertical lines 12 to approximately voltage potential $V_{SS}$. Note also that output 17 is also precharged by N-channel field effect transistor 18 to approximately $V_{SS}$ when clock signal $\phi 1$ goes high. When clock signal $\phi 1$ goes low then P-channel field effect transistor 16 is enabled thereby precharging node 15 to approximately voltage $V_{DD}$. A pair of adjacent P-channel field effect transistors 14a and 14b are then selected by an external decoder which is not shown, however, can be of the type disclosed in my co-pending patent application Ser. No. 896071, entitled "Versatile CMOS Decoder". The external decoder will always select adjacent transistors 14 thereby enabling one drive line and an adjacent sense line. Another decoder is used to select one of the row defining lines or horizontal lines 13. If it is assumed that P-channel transistor 14a, which couples vertical line 12a to node 17, is selected then one of the vertical lines adjacent to vertical line 12a will also be selected such as for instance vertical line 12b. Vertical line 12b then becomes charged to the precharge voltage applied to node 15. This precharge voltage can now be coupled to vertical line 12a if the memory cell location 11 between lines 12a and 12b contains a field effect transistor. This precharge signal is then coupled by P-channel transistor 14a to output 17. Since output 17 was previously precharged to voltage $V_{SS}$ the voltage coupled by the memory cell causes output 17 to change. The change will be maintained by back-to-back inverters 19 and 20.

Of course, if the memory cell location between vertical lines 12a and 12b does not contain a transistor then output node 17 would remain at the precharge voltage $V_{SS}$. Vertical line 12b serves as a drive line and line 12a serves as a sense line for ROM 10. Vertical lines 12a and 12b also serve as column select lines when their respective transistors 14a and 14b are enabled.

All P channel transistors 14 are responsive to decoded address inputs to their gates although some of the transistors, such as 14b, are in the drive lines, such as 12b, and others of the transistors, such as 14a, are in the sense lines, such as transistor 12a. As illustrated, the sense lines serve two adjacent columns of memory cell locations. The drive lines also serve two adjacent columns of memory cell locations, however, in the example illustrated the drive lines on the ends of the memory matrix only serve one column of memory cell locations. Although the preferred embodiment has been illustrated in the sole FIGURE, it will be understood that P channel transistors can be replaced by N channel transistors and the N channel transistors replaced by P channel and then interchanging $V_{DD}$ and $V_{SS}$ voltage terminals.

By now it should be appreciated that there has been provided a ROM having a reduced number of vertical lines by eliminating all the power supply lines through the ROM matrix. Accordingly, this ROM can be considered a virtual power supply ROM. In addition, less decoder signals are needed for the ROM of the present invention than are required for prior art virtual ground ROMs.

Consequently, while in accordance with the Patent Statutes, there has been described what at present is considered to be the preferred form of the invention, it will be obvious to those skilled in the art that numerous changes and modifications may be made herein without departing from the spirit and scope of the invention, and it is therefore aimed that the following claims cover all such modifications.

What is claimed as new and desired to secure by Letters Patent of the United States is:

1. A semiconductor memory having a plurality of read-only-memory cells arranged in an array of rows and columns, a plurality of vertical lines defining columns and a plurality of horizontal lines defining rows, comprising: first means for controllably precharging a first node to a first voltage potential, the first means being coupled between the first node and a first voltage potential node; a plurality of second means for controllably coupling every other one of the plurality of vertical lines to the first node; a plurality of third means for controllably coupling the vertical line which is between the every other one of the plurality of vertical lines to an output node; a plurality of fourth means for precharging the plurality of vertical lines to a second voltage potential, each of the plurality of fourth means being coupled between each of the plurality of vertical lines and a second voltage potential node; and fifth means coupled between the output node and the second voltage potential node for controllably precharging the output node to the second voltage potential.

2. The memory of claim 1 further including a pair of inverters arranged in a back-to-back configuration coupled to the output node to provide a static output for the memory.

3. The memory of claim 1 wherein the first means is a P-channel field effect transistor and the plurality of fourth means are N-channel field effect transistors.

4. A read-only-memory having a large number of memory cells arranged in an array of rows and columns of cells, the columns being defined by vertical lines and the rows being defined by horizontal lines, comprising: a first node being coupled to a predetermined number of the vertical lines to provide only one vertical line being coupled to the first node and being adjacent to each column of cells; first means for precharging the first node to a first voltage potential, the first means being coupled between the first node and a first voltage potential node; second means for coupling the predetermined number of vertical lines to the first node; an output node for providing an output from the memory cells, the output node being coupled to vertical lines which define a second side of the columns opposite to a first side defined by the predetermined number of vertical lines; and third means for precharging the vertical lines to a second voltage potential, the third means being coupled between the vertical lines and a second voltage potential node.

5. The read-only-memory of claim 4 further including a pair of inverters arranged in a back-to-back configuration and coupled to the output node to provide a static output.

6. The read-only-memory of claim 4 wherein the first means is a single P-channel field effect transistor.

7. The read-only-memory of claim 4 wherein the second means are a plurality of P-channel field effect transistors each coupled to a different one of the vertical lines.

8. The read-only-memory of claim 4 wherein the third means are a plurality of N-channel transistors each coupled to a different one of the vertical lines.

9. In a digital processing system, a memory for storing digital data and having a plurality of cells arranged in an array and having a plurality of columns, each of the columns being defined by a first and a second vertical line, the memory comprising: a first node; first means for precharging the first node, the first means being coupled between the first node and a first voltage potential node; second means for coupling each of the first vertical lines to the first node; an output node; third means for coupling each of the second vertical lines to the output node; and fourth means coupled between each of the first and second vertical lines and a second voltage potential node for precharging the first and second vertical lines to a second voltage potential.

10. In apparatus according to claim 9, further including fifth means coupled between the output node and the second voltage potential node for precharging the output node.

11. In apparatus according to claim 9, further including a first and a second inverter coupled in a back-to-back configuration to the output node.

12. In apparatus according to claim 9 wherein the first, second and third means are P-channel field effect transistors, and the fourth means are N-channel field effect transistors.

13. A read-only-memory having a plurality of memory cells arranged in an array having columns of cells, a first vertical line located between each column of cells and being shared by each adjacent column of cells, the first vertical line serving as a drive line for each of the adjacent column of cells, and a second vertical line located between a pair of columns so that each of the plurality of columns of cells is located between a first and a second vertical line, the second vertical line serving as a sense line for the pair of columns, the first and second vertical lines also serving as column select lines, and each of the second vertical lines being coupled to an output of the read-only-memory.

14. The read-only-memory of claim 13 wherein the first vertical lines are capable of being coupled to a first voltage potential, and further including means for precharging the first and second vertical lines to a second voltage potential.

* * * * *